United States Patent
Huang

(10) Patent No.: US 6,859,371 B2
(45) Date of Patent: Feb. 22, 2005

(54) ELECTROMAGNETIC INTERFERENCE (EMI) SHIELD STRUCTURE

(75) Inventor: Jing Jang Huang, Tao-Yuan Hsien (TW)

(73) Assignee: HannStar Display Corp. (TW)

( * ) Notice: Subject to any disclaimer, the term of this patent is extended or adjusted under 35 U.S.C. 154(b) by 0 days.

(21) Appl. No.: 10/259,115

(22) Filed: Sep. 27, 2002

(65) Prior Publication Data

US 2003/0223211 A1 Dec. 4, 2003

(30) Foreign Application Priority Data

May 30, 2002 (TW) ...................................... 91207904 U

(51) Int. Cl.⁷ ................................................ H05K 9/00
(52) U.S. Cl. ...................... 361/818; 361/800; 361/816; 361/796; 174/51; 174/35 R
(58) Field of Search ................................ 361/816, 818, 361/800, 724, 796, 75, 714; 174/35 R, 51; 455/307

(56) References Cited

U.S. PATENT DOCUMENTS

| | | | | |
|---|---|---|---|---|
| 5,400,949 A | * | 3/1995 | Hirvonen et al. | 228/180.22 |
| 5,548,084 A | * | 8/1996 | Tracy | 174/35 R |
| 5,579,212 A | * | 11/1996 | Albano et al. | 361/820 |
| 5,704,117 A | * | 1/1998 | Mok et al. | 29/841 |
| 5,822,182 A | * | 10/1998 | Scholder et al. | 361/683 |
| 6,239,359 B1 | * | 5/2001 | Lilienthal et al. | 174/35 GC |
| 6,243,274 B1 | * | 6/2001 | Willis | 361/816 |
| 6,377,475 B1 | * | 4/2002 | Reis | 361/818 |

* cited by examiner

*Primary Examiner*—Kamand Cuneo
*Assistant Examiner*—Hung S. Bui
(74) *Attorney, Agent, or Firm*—Morris, Manning & Martin, LLP; Tim Tingkang Xia, Esq.

(57) ABSTRACT

A structure of an EMI shield that can be easily installed to and removed from a base of an electronic equipment, where the base has at least one hook. The EMI shield comprises a casing for covering a circuit board on the base, wherein the casing includes a plurality of holes for thermal dissipation, and a plurality of flanges extending laterally from a bottom of a lateral side of the casing. The flanges comprise at least one groove to engage with the at least one hook of the base for positioning the EMI shield, and an opening, which is extended to a lateral side of the casing so that a power cord of the circuit board can be through the opening. At least one of the flanges comprises a spring finger, which is engageable with a concave portion of the base for fixing the EMI shield on the base without using screws. Further, the spring finger comprises a shoulder, which projects outward from the concave portion of the base, whereby when the spring finger is pulled and separated from the concave portion of the base, the EMI shield can be removed from the base.

14 Claims, 5 Drawing Sheets

ELECTROMAGNETIC INTERFERENCE (EMI) SHIELD STRUCTURE

FIELD OF THE PRESENT INVENTION

The present invention generally relates to an EMI (electromagnetic interference) shield for cutting off electromagnetic wave, and more particularly, to an EMI shield which can be easily installed to and removed from a base of an electronic equipment without using tools.

BACKGROUND OF THE PRESENT INVENTION

In the development for computer applications, the main stream of display screens have gradually shifted from high-radiation and high-electric power consumption cathode ray tubes (CRTs) to low-radiation, non-illuminant and lower-electric power consumption Thin-Film Transistor Liquid Crystal Display (TFT-LCD) panels.

In general, an LCD mainly includes a liquid crystal panel, a lamp tube set, a back light module (including a plurality of thin films, an acrylic light guiding plate, a light source, and a reflection sheet), and a circuit board, which contain certain electrical elements. While an electronic device such as an LCD is in use, the electromagnetic wave is generated from electrical elements, and the electromagnetic wave interferes with the operation of the electronic device. For the purpose of reducing the interference with electromagnetic wave, there is a demand for using a metal cover as an EMI member for cutting off the electromagnetic wave to improve the operational stability of the LCD panel.

FIG. 1 shows the drawing of a conventional EMI shield. The conventional EMI shield 100 comprises a cover 10 with a plurality of flanges 11, and each of the flanges 11 which has at least one screw hole 12. A screw (not shown) can penetrate through the screw hole 12 to fix the EMI shield 100 on an electronic equipment (not shown).

The conventional method for fixing the EMI shield on the base is utilizing screws. The deficiency of the method is described as follows. Among other things, the cost and the time for fabricating the EMI shield are increasing, and the conventional method is unsuitable for the present thin-type LCD panel.

One objective of the present invention is to overcome the problems of the prior art set out above, by providing a structure of an EMI shield, which can be easily installed to and removed from a base without using tools.

SUMMARY OF THE INVENTION

In one aspect, the invention provides a structure of an EMI shield, which can be easily installed to and removed from a base of an electronic equipment. The EMI shield comprises a casing with a plurality of holes for thermal dissipation, for covering a circuit board on the base of the electronic equipment, and a plurality of flanges extending laterally from a bottom of a lateral side of the casing, wherein at least one of the flanges further comprises an opening, which is extended to a lateral side of the casing, and a power cord of the circuit board can be through out from the opening.

In a preferred embodiment of the present invention, the base of the electronic equipment further comprises at least one hook, and the flanges of the EMI shield comprise at least one groove to engage with the hook for positioning the EMI shield.

Furthermore, the base comprises a concave portion, and at least one of the flanges comprises a spring finger, which is engaged in the concave portion, for fixing the EMI shield on the base.

Furthermore, the spring finger comprises a shoulder, which is outward from the concave portion of the base, and the EMI shield can be removed from the base by pulling the shoulder, whereby the spring finger is separated from the concave portion of the base.

Furthermore, the EMI shield is made of an elastic metal in a extrusion molding manner, or is made of plastic in a injection molding manner, wherein the plastic is coating a metallic material. Due to this arrangement, it is possible to cut off the electromagnetic waves emitted from the electronic equipment, and it is possible to prevent malfunction of the electronic parts.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PRESENT INVENTION

Figure 1:
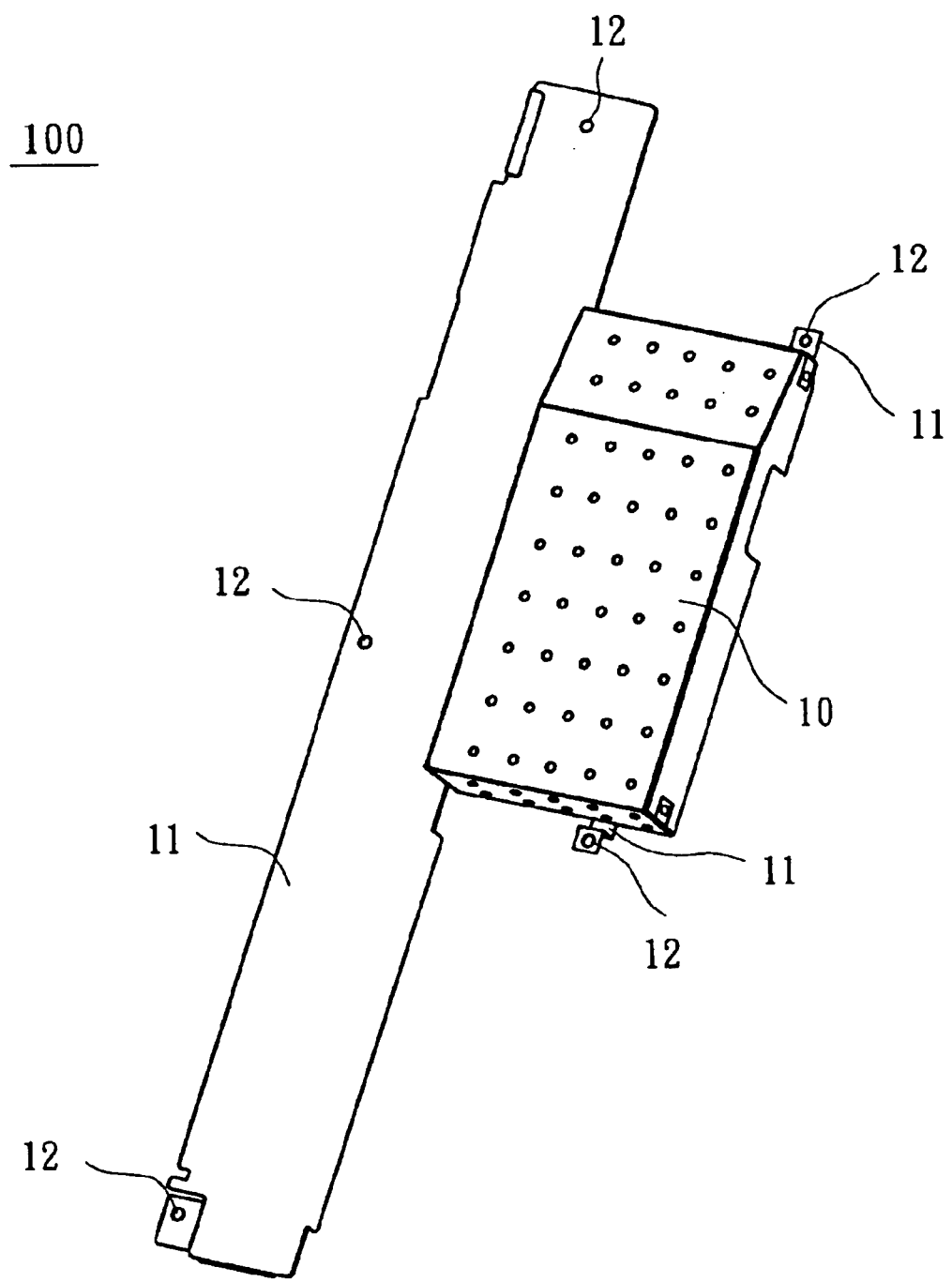
FIG. 1 (prior art) is perspective view of a conventional EMI shield.
Figure 2:
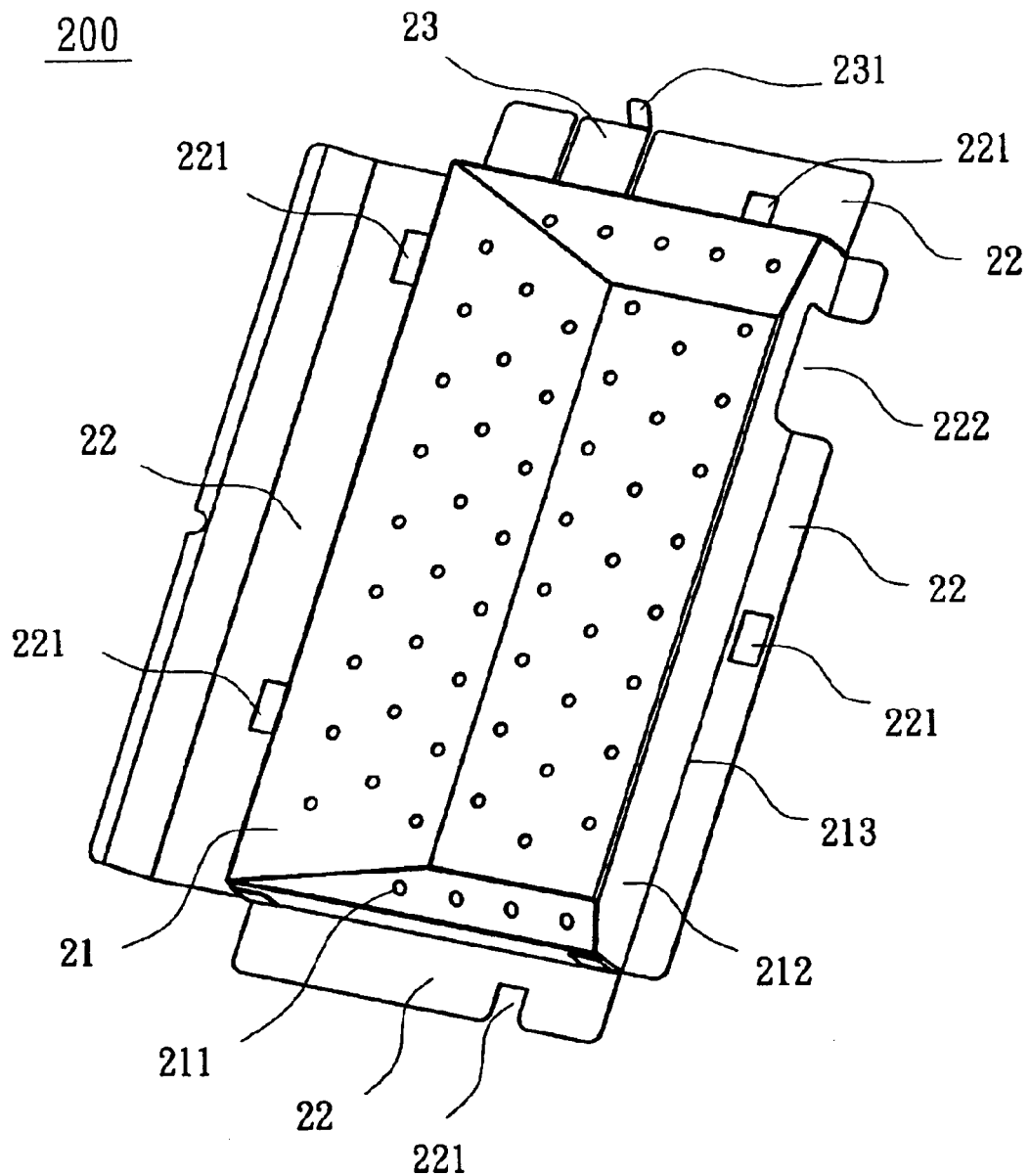
FIG. 2 is a frontal view of an embodiment of an EMI shield according to the present invention.
Figure 3:
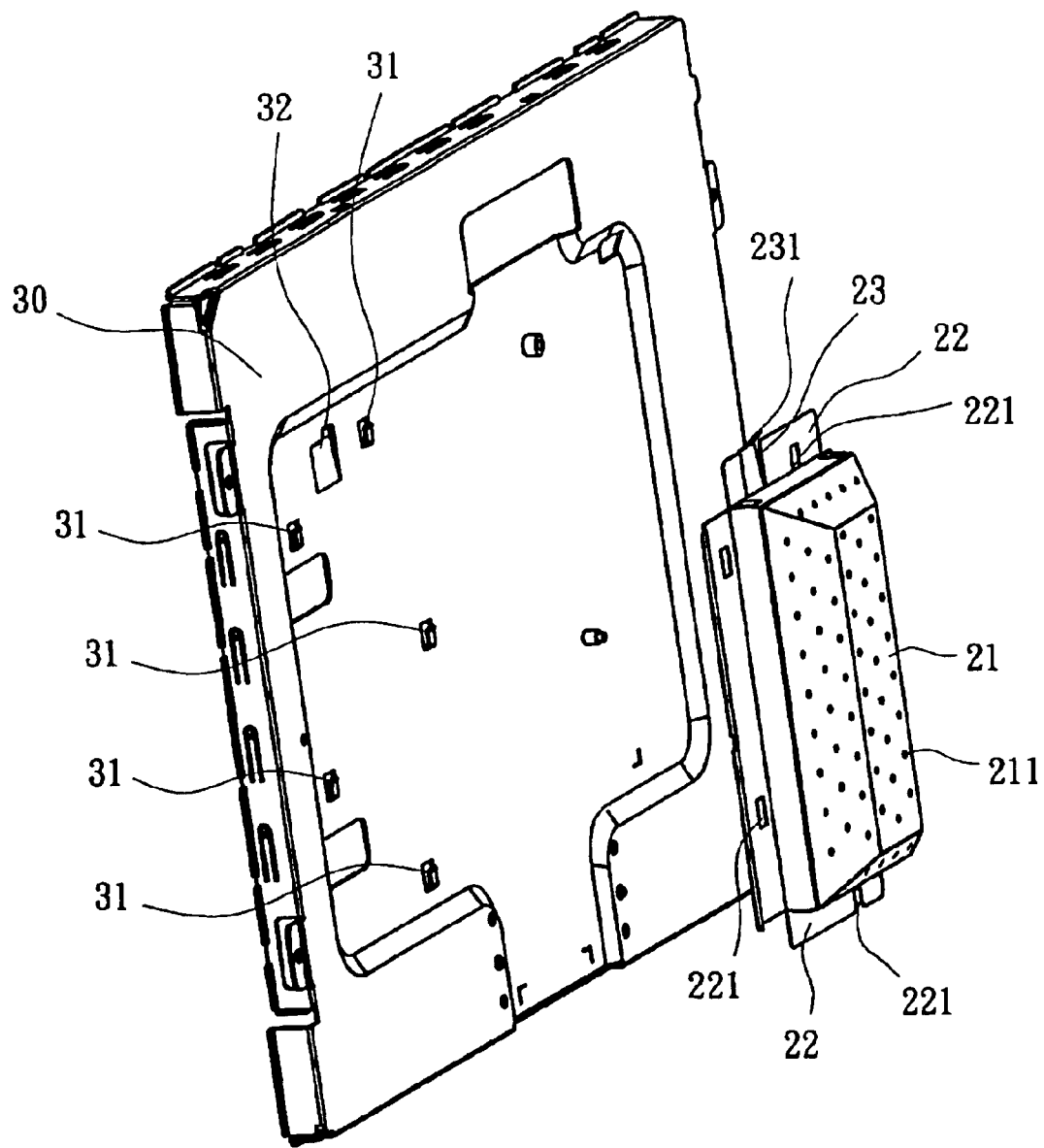
FIG. 3 is an exploded perspective view of the EMI shield, wherein the EMI shield is removed from a base.

A structure of an EMI shield according to an embodiment of the present invention will be described with reference to the drawings. Referring now to FIG. 2, the EMI shield 200 has a casing 21, wherein the casing 21 includes a plurality of holes 211 for thermal dissipation, and the casing 21 can cover a circuit board (not shown) on a base 30 of an electronic equipment as shown in FIG. 3. The EMI shield 200 further comprises a plurality of flanges 22 extending laterally from a bottom 213 of a lateral side 212 of the casing 21, and at least one of the flanges 22 includes an opening 222, which is extended to a lateral side 212 of the casing 21. Due to this arrangement, a power cord (not shown) of the circuit board can be through out from the opening 222.

Referring to FIG. 3, it is an exploded perspective view of the EMI shield 200, wherein the EMI shield 200 is removed from the base 30. The base 30 includes at least one hook 31, and the flanges 22 include at least one groove 221 to engage with the hook 31 for positioning the EMI shield 200 on the base 30.

Figure 4:
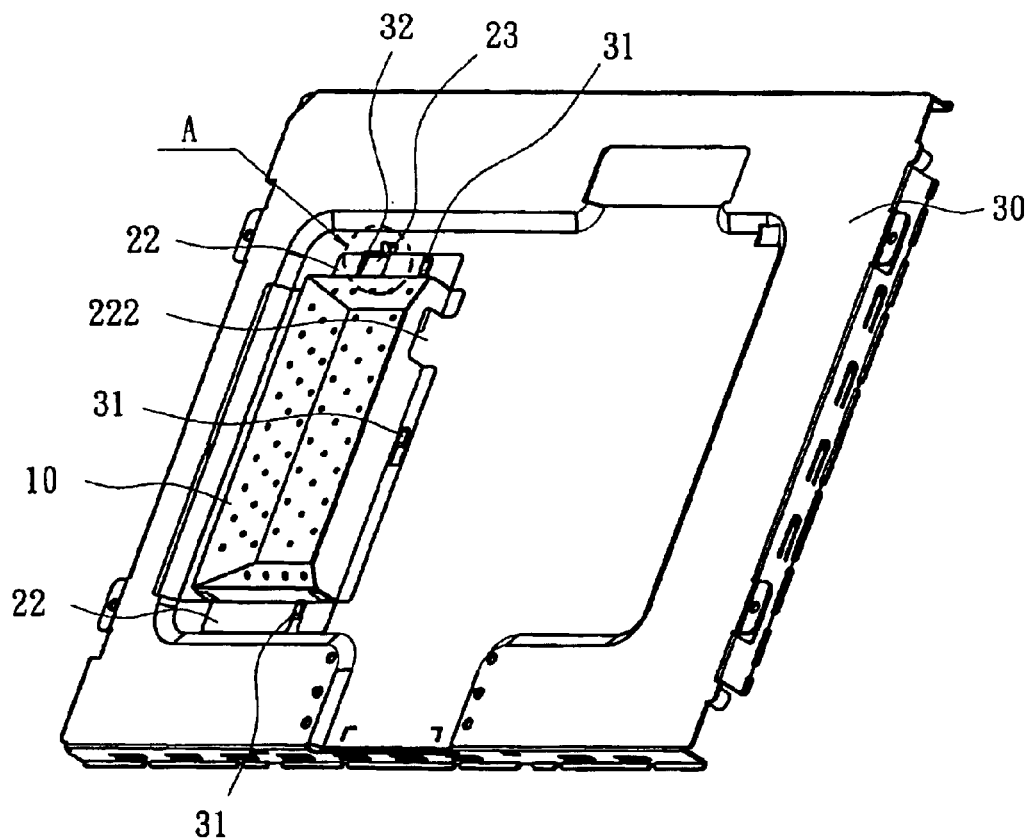
FIG. 4 is an exploded perspective view of the EMI shield, wherein the EMI shield is installed to a base.

Referring to FIG. 4, it is an exploded perspective view of the EMI shield 200, wherein the EMI shield 200 is installed to the base 30. The flanges 22 of the EMI shield 200 further include a spring finger 23, which can be and is engaged with a concave portion 32 of the base 30, for fixing the EMI shield 200 on the base 30 such that the EMI shield 200 can be easily installed to the base 30 without using screws. The spring finger 23 is integrally provided with the flange 22, which is made of an elastic metal in an extrusion molding manner or alternatively is made of plastic in an injection molding manner.

Figure 5:
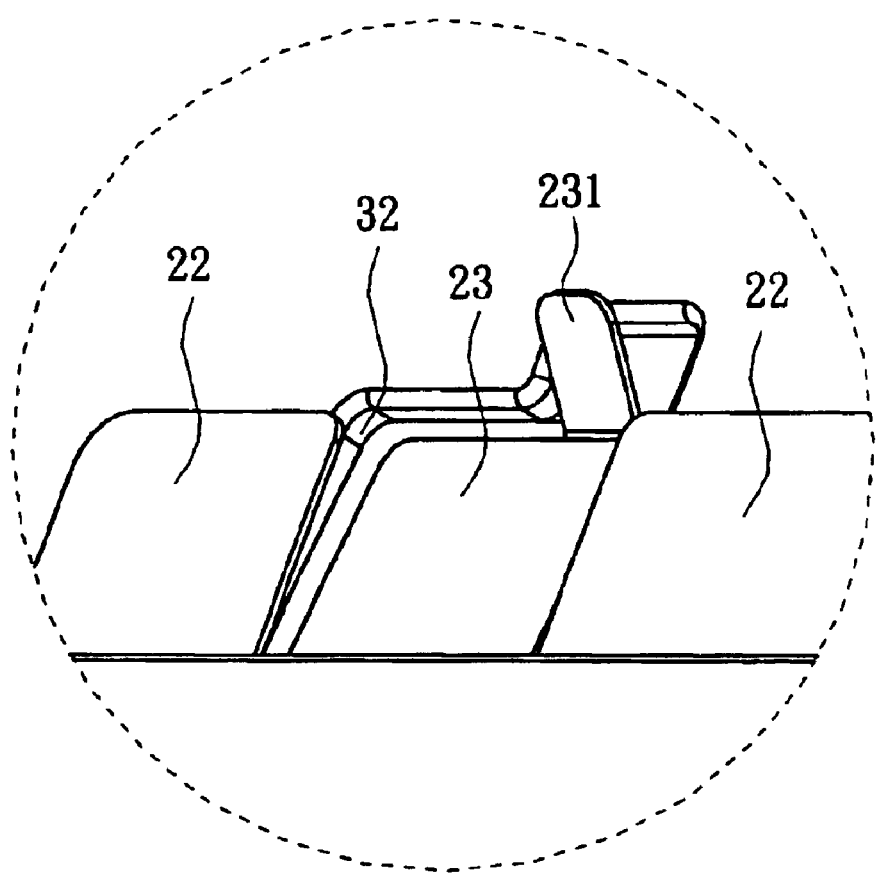
FIG. 5 is a partial frontal view of an embodiment of a spring finger of the EMI shield according to the present invention.

Referring to FIG. 5, it is a partial frontal view of the spring finger 23 of the EMI shield 200 according to the present invention. The spring finger 23 includes a shoulder 231, which projects outward from the concave portion 32 of the base 30. By pulling the shoulder 231, the spring finger 23 can be separated from the concave portion 32 of the base 30, and then the EMI shield 200 is removed from the base 30.

In one embodiment of the present invention, the flanges 22 and the spring finger 23 can be integrally provided with the casing 21. For example, the EMI shield 200 is made of an elastic metal in an extrusion molding manner, or is made of plastic in an injection molding manner. Moreover, the plastic can be a coating over a metallic material.

According to the present invention, it is possible to reduce the electromagnetic waves emitted from the electronic equipment such as an LCD, and the EMI shield 200 can be easily installed to and removed from the base 30 without using tools.

Although the invention has been described in several embodiments with a certain degree of particularity, it is understood that the present disclosure of the several embodiments can be changed in the details of construction and in the combination and arrangement of parts without departing from the spirit and the scope of the invention as hereinafter claimed.

What is claimed is:

1. A structure of an EMI shield for covering a circuit board-on a base of an electronic equipment, wherein the base of the electronic equipment comprises a concave portion, comprising:
   a casing; and
   a plurality of flanges extending laterally from a bottom of a lateral side of the casing, wherein at least one of the flanges comprises a spring finger that is engageable with the concave portion for fixing the EMI shield on the base, wherein the spring finger comprises a shoulder, which projects outward from the concave portion of the base, whereby when the spring finger is pulled and separated from the concave portion of the base, the EMI shield is removed from the base.

2. A structure of an EMI shield as claimed in claim 1, wherein the casing comprises a plurality of holes for thermal dissipation.

3. A structure of an EMI shield as claimed in claim 1, wherein the base of the electronic equipment comprises at least one hook.

4. A structure of an EMI shield as claimed in claim 3, wherein the flanges comprise at least one groove to engage with the hook of the base for positioning the EMI shield.

5. A structure of an EMI shield as claimed in claim 1, wherein at least one of the flanges further comprises an opening, which is extended to a lateral side of the casing to allow a power cord of the circuit board to be through out from the opening.

6. A structure of an EMI shield as claimed in claim 1, wherein the EMI shield is made of an elastic metal in an extrusion molding manner.

7. A structure of an EMI shield as claimed in claim 1, wherein the EMI shield is made of plastic in an injection molding manner, where the plastic can be a coating over a metallic material.

8. A structure of an EMI shield for an electronic equipment with a base, wherein the base comprises a concave portion and at least one hook, comprising:
   a casing with a plurality of holes for thermal dissipation on the base of the electronic equipment; and
   a plurality of flanges extending laterally from a bottom of a lateral side of the casing, wherein the flanges comprise at least one groove that is engageable with the hook of the base for positioning the EMI shield on the base, and at least one of the flange comprises a spring finger, which is engageable with the concave portion for fixing the EMI shield on the base.

9. A structure of an EMI shield as claimed in claim 8, wherein the spring finger further comprises a shoulder, which projects outward from the concave portion of the base, whereby when the spring finger is pulled and separated from the concave portion of the base, the EMI shield is removed from the base.

10. A structure of an EMI shield for covering a circuit board on a base of an electronic equipment, wherein the base includes at least one hook and a concave portion, comprising:
    a casing having a plurality of holes for thermal dissipation; and
    a plurality of flanges extending laterally from a bottom of a lateral side of the casing, wherein the flanges include at least one groove to engage with the hook of the base, and at least one of the flanges includes a spring finger, which is engageable with the concave portion of the base for fixing the EMI shield on the base.

11. A structure of an EMI shield as claimed in claim 10, wherein the spring finger further comprises a shoulder, which projects outward from the concave portion of the base, whereby when the spring finger is pulled and separated from the concave portion of the base, the EMI shield is removed from the base.

12. A structure of an EMI shield as claimed in claim 10, wherein at least one of the flanges further comprises an opening which is extended to a lateral of the casing to allow a power cord of the circuit board to be through out from the opening.

13. A structure of an EMI shield as claimed in claim 10, wherein the EMI shield is made of an elastic metal in an extrusion molding manner.

14. A structure of an EMI shield as claimed in claim 10, wherein the EMI shield is made of plastic in an injection molding manner, where the plastic can be a coating over a metallic material.

* * * * *